US009076562B2

(12) United States Patent
Blackburn

(10) Patent No.: US 9,076,562 B2
(45) Date of Patent: Jul. 7, 2015

(54) PHASE PLATE

(71) Applicant: Hitachi High-Technologies Corporation, Minato-ku, Tokyo (JP)

(72) Inventor: Arthur Blackburn, Girton (GB)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 0 days.

(21) Appl. No.: 13/726,260

(22) Filed: Dec. 24, 2012

(65) Prior Publication Data

US 2013/0193322 A1 Aug. 1, 2013

(30) Foreign Application Priority Data

Jan. 31, 2012 (EP) .................................... 12153378

(51) Int. Cl.
| | | |
|---|---|---|
| *G21K 5/04* | (2006.01) | |
| *G21K 5/02* | (2006.01) | |
| *H01J 37/26* | (2006.01) | |
| *G21K 1/08* | (2006.01) | |
| *H01J 37/147* | (2006.01) | |
| *B82B 1/00* | (2006.01) | |

(52) U.S. Cl.
CPC . *G21K 5/02* (2013.01); *H01J 37/26* (2013.01); *G21K 1/08* (2013.01); *B82B 1/008* (2013.01); *H01J 37/147* (2013.01); *H01J 2237/1523* (2013.01); *H01J 2237/2614* (2013.01)

(58) Field of Classification Search
USPC .................. 250/396 R, 397, 398, 396 ML
See application file for complete search history.

(56) References Cited

U.S. PATENT DOCUMENTS 5,814,815 A * 9/1998 Matsumoto et al. .......... 250/311
2014/0346354 A1* 11/2014 Verbeeck et al. ............. 250/307

FOREIGN PATENT DOCUMENTS

| EP | 1 950 789 A1 | 7/2008 | |
|---|---|---|---|
| JP | 60-7048 | 1/1985 | |
| WO | WO 2013/092762 A1 | 6/2013 | |
| WO | WO 2013092762 | * 6/2013 | .............. H01J 37/26 |

OTHER PUBLICATIONS

D. B. Williams et al., Transmission Electron Microscopy, $2^{nd}$ Ed., Springer, 2009.
L. Reimer et al., Transmission Electron Microscopy Physics if Image Formation, $5^{th}$ Ed, Springer, 2008).
Kuniaki Nagayama, Development of phase plates for electron microscopes and their biological application, European Biophysical Journal, 2008, pp. 345-358, vol. 37.
D. R. Danev, et al., Transmission Electron Microscopy with Zernike Phase Plate, Ultramicroscopy 88, 2001, pp. 243-252.
E. Majorovits et al., Optimizing phase contrast in transmission electron microscopy with an electrostatic (Boersch) Phase plate, Ultramicroscopy 107, 2007, pp. 213-226.
M. J. Donahue et al., OOMMF User's Guide, Version 1.) NIST, Gaithersburg, MD (Sep. 1999).

(Continued)

*Primary Examiner* — Nicole Ippolito
(74) *Attorney, Agent, or Firm* — Baker & Botts L.L.P.

(57) ABSTRACT

A phase plate for a charged particle beam system, such as a transmission electron microscope (TEM), is described. The phase plate comprises a support having a through-hole and an elongate member which is magnetisable in a direction along its length and which extends partially across the through-hole and which is narrower than the through-hole.

17 Claims, 12 Drawing Sheets

(56) References Cited

OTHER PUBLICATIONS

G. F. Missiroli et al., Electron interferometry and interference electron microscopy, Japanese Physics E: Sce. Instrum., 1981, pp. 649-671, vol. 14.

J. C. H. Spence, High Resolution Electron Microscopy, 3$^{rd}$ Ed, Oxford University press, 2003.

L. Riemer et al., Transmission Electron Microscopy, Physics of Image Formation, (5$^{th}$ Ed, Springer, 2008).

Chapter 4, Fraunhofer diffraction and Lenses.

Juan C. Idrobo et al., Vortex beams for atomic resolution dichroism, Journal of Electron Microscopy 60(5), 2011.

OOMMF User's Guide, Jul. 19, 2010.

Communication Pursuant to Article 94(3) EPC—in EP Appln. 12153378.0-1556, dated Sep. 25, 2013 (5 pgs.).

\* cited by examiner

PHASE PLATE

FIELD OF INVENTION

The present invention relates to a phase plate for a charged particle beam system.

BACKGROUND

Transmission electron microscopes (TEMs) can be used in a wide range of applications, such as microelectronics, materials science and biology. An overview of transmission electron microscopes can be found in Chapter 1 of D. B. Williams and C. B. Carter, Transmission Electron Microscopy, (2nd Ed., Springer, 2009).

Satisfactory imaging of so-called "weak phase objects", such as specimens which comprise biological or other organic material, can be difficult with conventional TEMs.

For weak phase objects, virtually all of the contrast in the image arises from interference between electrons scattered by the specimen and unscattered electrons. The image intensity thus depends on the phase shift of the scattered electrons relative to the unscattered electrons and on the spatial frequency composition of the observed region of the specimen.

Within the widely used weak phase object approximation, see for example Chapter 6.2 of L. Riemer and H. Kohl, Transmission Electron Microscopy: Physics of Image Formation, (5th Ed, Springer, 2008), the contrast can be described by a phase contrast transfer function (PCTF) which depends on the imaging electron wavelength, lens aberrations, lens defocus and the spatial frequency composition of the observed sample region of the (weak phase object) sample. For a weak phase object and a focussed TEM image, the phase contrast at low spatial frequency (typically corresponding to features having length scales greater than about 3 nm) tends towards zero and is less than half of the contrast available to higher spatial frequency components. Thus, it can be difficult to distinguish phase variations which occur at low spatial frequency. However, for biological samples in particular, there is significant information of interest at these length scales.

While the contrast improves at higher spatial frequencies, for certain lens arrangements, the contrast can become inverted at higher spatial frequencies if these are allowed to pass through the imaging apertures in the system. For atomic-resolution images, this can result in atoms either appearing as black or white dots depending on their spatial separation, thereby making interpretation of the images more challenging.

To try and overcome these problems, TEM operators collect images at different defocus settings which have different phase contrast transfer functions, allowing some possible enhancement of the phase contrast at lower spatial frequencies and changing the frequency at which inversions occur at higher spatial frequencies. Using different images and image processing software, an operator provided with details of the microscope characteristics can construct a single image which allows image contrast to be interpreted more easily.

Some experienced TEM operators may even be able to interpret a series of images and gain an understanding of the phase variation within the sample without the aid of image processing software. However, the approach of collecting multiple images at different defocus settings has drawbacks. Firstly, the sample receives a higher dose of electrons. Generally, electron dose is minimized to reduce the possibility of damaging the sample. Secondly, choosing appropriate values of defocus and interpreting multiple images requires considerable skill and knowledge. Thirdly the defocused images do not permit straightforward observation of the sample at the ultimate (focused, with no contrast inversions) resolution of the microscope.

Phase plates are used as means to alleviate some of these problems by providing an enhancement of phase contrast over a range of frequencies. A review of phase plates for electron microscopes used in biological applications, where the intention is to enhance low spatial frequency phase contrast, is given by Kuniaki Nagayama: "Development of phase plates for electron microscopes and their biological application", European Biophysical Journal, pages 345 to 358, volume 37 (2008).

One well-known phase plate is a Zernike phase plate. This advances the phase of the scattered electrons by $\pi/2$ relative to the unscattered electrons which appear near and in the central region of the back focal plane of the microscope. In its simplest form such a phase plate is formed from a continuous or perforated film placed near the back focal plane, where the central region is thinner than the surrounding region or, in the case of the perforated film, absent.

In this type of film based phase plate, some scattering inevitably occurs in the film. Thus some information from the sample object is lost when using this type of phase plate. This type of phase plate can also suffer from beam induced charge up and contamination. The phase plate also exhibits energy dependency. A further particular problem is that it can be difficult to control accurately the thickness of the film and, thus, the phase shift. Furthermore, the thickness of the film can change over time due to contamination. Further details of some of these problems are detailed in R. Danev, K. Nagayama, Transmission Electron Microscopy with Zernike Phase Plate, Ultramicroscopy 88, 243 (2001).

A Zernike style phase plate using an electrostatic Einzel lens arrangement in the central region to achieve the $\pi/2$ phase shift (as first proposed by Boersch in 1947 and also known as a "Boersch phase plate") overcomes some of these problems. However, this phase plate still suffers some disadvantages. In particular, the support structure for the central electrostatic lens tends to block certain spatial frequency components. Furthermore, the phase contrast transfer function is only enhanced above a certain spatial frequency (typically about ($\frac{1}{6}$) nm$^{-1}$) due to the finite size of a central lens. Moreover, the phase shift varies with electron energy. Additionally, the phase plate has a large cross-sectional area and so is prone to contamination (particularly on the rim around the unscattered beam focus) and to charging up. The phase plate is more complex to fabricate and install since it requires electrical contacts to electrodes. Also, once installed, the phase plate voltages need to be tuned for specific beam energies, as detailed by for example E. Majorovits, B. Barton, K. Schultheiss et al., Optimizing phase contrast in transmission electron microscopy with an electrostatic (Boersch) phase plate, Ultramicroscopy 107, 213 (2007).

Another known type of phase plate is a Zernike-style phase plate with a magnetic central ring which provides a $\pi/2$ phase shift at the centre of the beam near the back focal plane, such as in Japanese patent application 58-112718 (1985). This structure too suffers several disadvantages. Similar to its electrostatic counterpart, the phase contrast transfer function is only enhanced above certain spatial frequency due to the finite size of central aperture. This phase plate too is prone to contamination, particularly around the rim surrounding the central unscattered beam. In addition, similar to its electrostatic counterpart, the support structure blocks certain spatial frequency components.

Another form of phase plate is the Hilbert-type phase plate. This type of phase plate creates a $\pi$ phase shift over a half plane at or near the back focal plane (BFP) or a plane conjugate to the BFP. As with the Zernike phase plate, this can be realized with a thin film to create the π phase shift over the half plane, but this has similar disadvantages of charge-up, contamination, loss of information, energy dependency, and difficulty to control accurately the thickness of the film. Further, the resulting image appears as if illuminated from a specific direction, with shadowing artefacts appearing in the image.

A Hilbert-type phase plate using magnetic bar spanning the centre of the BFP overcomes some of these problems. However, for optimum contrast to be gained from this type of phase plate, the magnetic bar must be placed very close the central unscattered beam, and may even directly intersect the unscattered beam. This can lead to contamination and charge up. As with the images produced from all Hilbert phase plates, the resulting images have a characteristic of appearing illuminated from one side, with shadow-like artefacts appearing in the image.

SUMMARY

The present invention seeks to provide an improved phase plate.

According to a first aspect of the present invention there is provided a phase plate for a charged particle beam system comprising a support having a through-hole and an elongate member which is magnetisable in a direction along its length and which extends partially across the through-hole and which is narrower than the through-hole.

According to a second aspect of the present invention there is provided a phase plate for a charged particle beam system comprising a support having a through-hole and a magnetic elongate member which extends partially across the through-hole and which is narrower than the through-hole.

Thus, magnetic flux emerges or enters the end of the magnetic member which can introduce a spiral-like phase shift to charge carriers passing through the through-hole. The magnetic member can have a small cross section which need not intersect the scattered beam and need only approach the beam from a minimum of one point on the aperture edge. This can help reduce beam induced contamination and allow passage of a wider range of spatial frequency components. It can help to reduce low-frequency cut off. It can also help to reduce long-range shadowing artefacts in the image compared to Hilbert-type phase plates.

The elongate member may be no wider than 1 μm or 500 nm.

The elongate member may have a width, w, and the through-hole may have a width, d, wherein d≥20·w or d≥50·w.

The through-hole has a midpoint between first and second points on a perimeter of the through-hole and the elongate member may extend from the first point on the perimeter towards the second point without crossing the midpoint. However, the elongate member may cross the midpoint.

The through-hole may be generally circular. The support may be generally plate-like. An arm portion of the support member may extend into the through-hole and the arm portion may support the elongate member.

The elongate member may have a thickness of no more than 200 nm or no more than 100 nm. The elongate member may have a thickness of at least 5 nm or at least 10 nm. The elongate member may comprise nickel, cobalt and/or iron. The elongate member may have a magnetic flux of $4 \times 10^{-15}$ Wb or integer multiples of $4 \times 10^{-15}$ Wb passing through a transverse cross section of the elongate member which is parallel to the optical axis. Thus, the elongate member may direct a magnetic flux of $4 \times 10^{-15}$ Wb or integer multiples of $4 \times 10^{-15}$ Wb in a plane perpendicular to the optical axis.

The phase plate may further comprise a conductive layer overlying the elongate member and, optionally the support. The conductive layer may comprise a layer of gold. The conductive layer may be used primarily to help prevent charge build up and so the conductive layer can be thin, e.g. less than 100 nm or even less than 10 nm. In some applications, however, the phase plate is used to provide a beam-forming aperture and so the conductive layer may be thicker, e.g. about 1 μm or more.

The through-hole may have a diameter or largest dimension, d, of at least 10 μm, at least 20 μm, at least 50 μm and may no more than 100 μm. The through-hole may have a diameter or largest dimension, d, of at least 100 μm, at least 200 μm, at least 500 μm and may no more than 1000 μm. In some applications, for example if the phase plate is used in a microlens arrangement, then d may be less than 10 μm.

The through-hole may have a diameter or largest dimension, d, and the elongate member may have a length, L, such that L≥d. The elongate member may have a length, L, such that L≥2d, L≥5d or L≥10d.

According to a third aspect of the present invention there is provided a charged particle beam system comprising a charged particle beam source, an objective lens and a phase plate disposed downstream or upstream of the objective lens.

The phase plate may be disposed at or near to a back focal plane of the objective lens. The charged particle beam system may be operable as a transmission electron microscope, a scanning electron microscope and/or a scanning transmission electron microscope.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
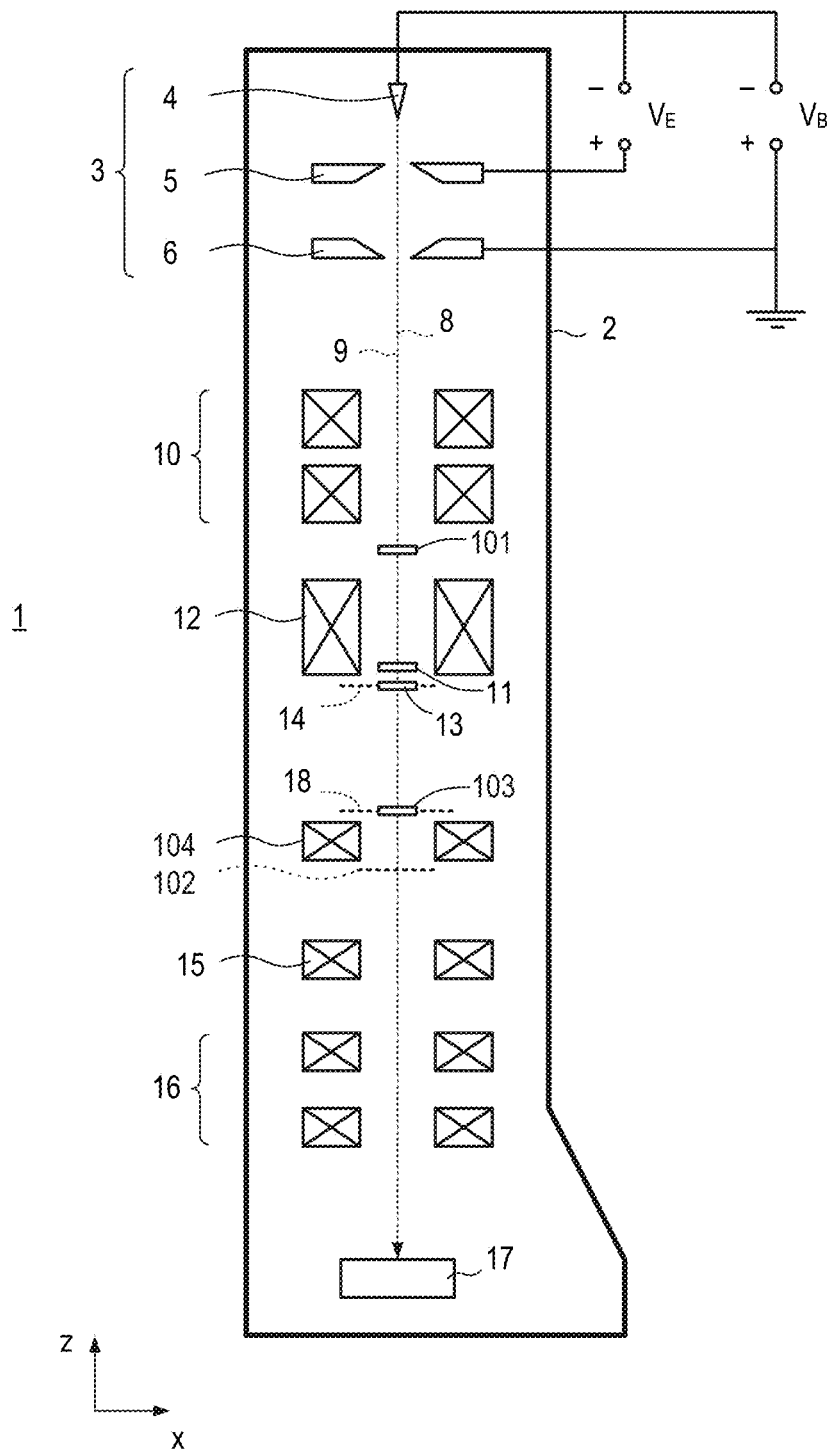
FIG. 1 is a schematic diagram of a transmission electron microscope.

FIG. 1 shows an electron microscope 1. The microscope 1 can operate as a transmission electron microscope (TEM) or as a scanning transmission electron microscope (STEM). The microscope 1 includes a housing 2 (usually referred to as the "column") connected to a high or ultra-high vacuum pumping system (not shown). At one end, the column 2 houses an electron source 3 including a cathode 4, extraction electrode 5 and anode 6. A bias $V_E$ between the cathode 4 and extraction electrode 5 is used to cause the cathode 4 to emit an electron beam 8. A bias $V_B$ (herein referred to as the "the beam voltage") between the cathode 4 and the anode 6 can be used to accelerate the electron beam 8. The beam voltage, $V_B$, in the range of about 10 kV to about 1 MV can be used and is typically in the range about 100 kV to about 400 kV.

The electron beam 8 travels towards the other end of the column 2, along an optical axis 9, through a condenser lens 10, a condenser aperture 101, a removable specimen 11, an objective lens 12, a phase plate 13 located at or near the back focal plane 14 of the objective lens 12 or near a plane conjugate to it such as conjugate plane 102, a selected area diffraction aperture 103, a diffraction lens 104, an intermediate lens 15 and a projector lens 16 to reach a detector 17. Some elements, in particular deflection coils and correction coils, are not shown in FIG. 1 for clarity.

Figures 2, 3:
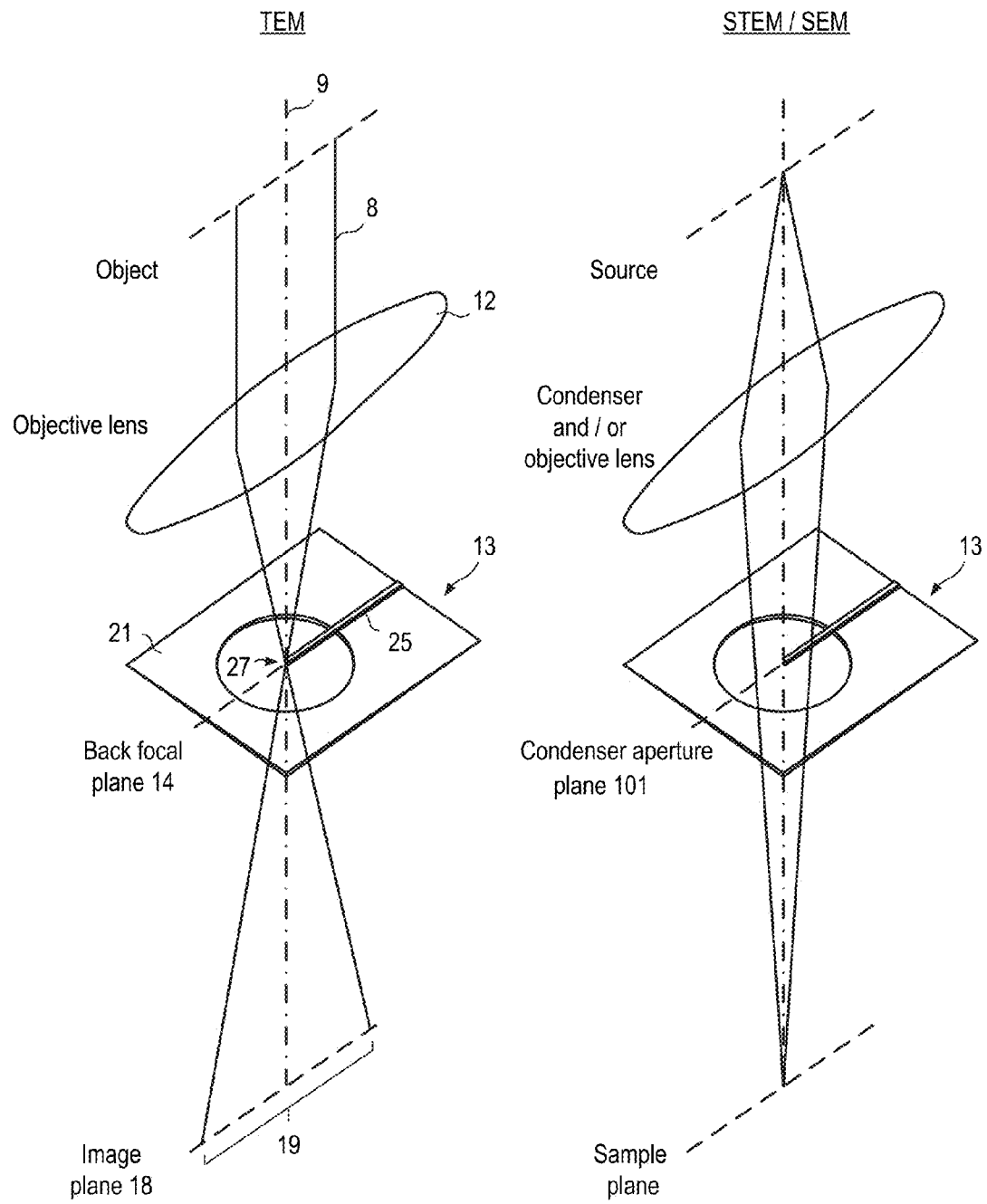
FIG. 2 illustrates position and structure of a phase plate in a transmission electron microscope.
FIG. 3 illustrates position and structure of a phase plate in a scanning electron microscope or scanning transmission electron microscope.

Referring also to FIG. 2 or 3, the phase plate 13 helps to produce an image 19 at an image plane 18 where the intensity highlights regions of phase shift change within the sample 11. The phase plate 13 can also be used in the condenser aperture position 101 in an STEM or scanning electron microscope arrangement.

Figure 4:
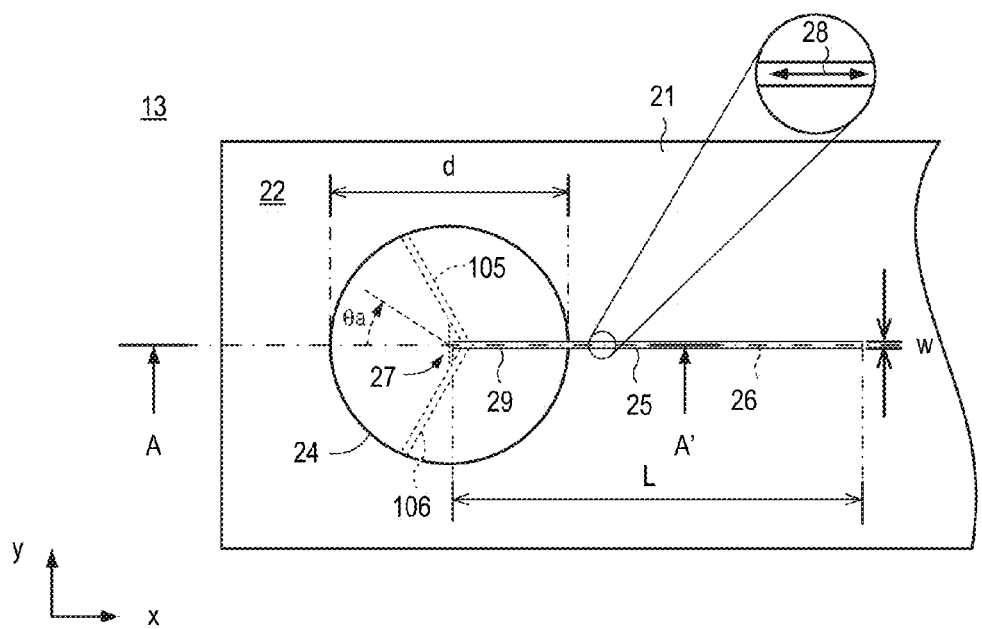
FIG. 4 is a plan view of a phase plate.
Figure 5:
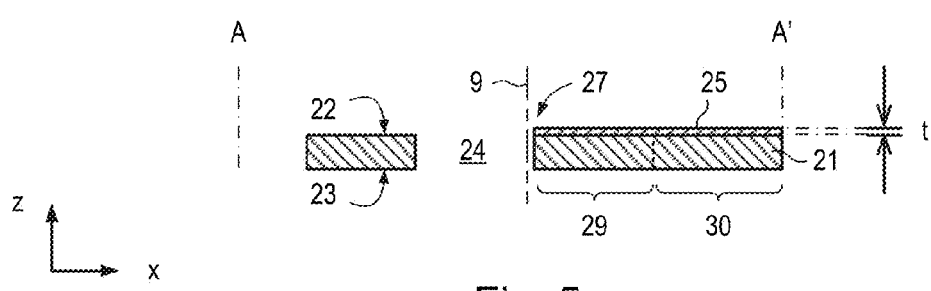
FIG. 5 is a cross-sectional view of the phase plate shown in FIG. 4.
Figure 6:
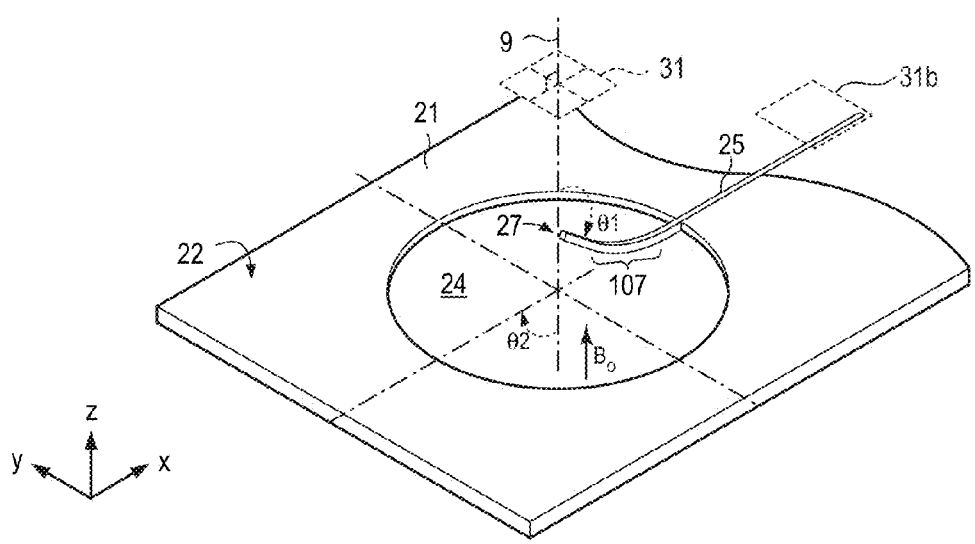
FIG. 6 is an isometric view of the phase plate shown in FIG. 4.

Referring to FIGS. 4, 5 and 6, the phase plate 13 is shown in more detail.

The phase plate 13 includes a flat, non-magnetic support member 21 having upper and lower faces 22, 23 and a circular opening 24 extending between the upper and lower faces 22, 23. The support member 21 carries an elongate magnetic member 25 on its upper face 22. In this case, the elongate magnetic member 25 takes the form of a thin, narrow strip (or "flat bar") having a generally rectangular transverse cross section. However, the magnetic member 25 can have other transverse cross-sectional shapes. For example, the magnetic member 25 can take the form of a rod having a circular cross section.

In this case, the opening 24 has a diameter, d, of about 50 μm and the magnetic member 25 has a thickness, t, of about 20 nm, a width, w, of about 200 nm and a length, L, of about 100 μm, i.e. L≈2d. The member 25 can be shorter or longer, preferably such that L>d. The magnetic member 25 has a longitudinal axis 26 and a distal end 27. The magnetic member 25 is magnetized either under the influence of a magnetic field present within the microscope or in an external magnetic field prior to its introduction into microscope, such that its magnetization 28 is aligned predominantly along the magnetic member 25.

The properties of the magnetic member 25 are such that the member 25 has a steady magnetic flux which emerges from the distal end 27. Preferably, the magnetic member 25 is made from a ferromagnetic material in order to achieve the smallest possible cross-section. However, a ferrimagnetic material can be used. The properties of the material used are such that the material can sustain a magnetization 28 predominantly in alignment along the magnetic member 25 while it is in use in the microscope 1. When the phase plate 13 is to be used in the absence of any external applied field and the magnetic member 25 is formed of a typical ferromagnetic material (such as cobalt or permalloy), then the thickness of the member 25 is preferably greater than 1 nm to help ensure that magnetisation 28 lies in the plane of the film, i.e. along the member 25.

The geometry of the magnetic member 25 preferably is such that a central portion of the member 25 forms a single magnetic domain. A typical geometry of around 200 nm by 20 nm by 100 μm in a ferromagnetic material such as cobalt or permalloy allows the central region to form into a single domain, with the magnetisation aligned along the axis 26.

The magnetic member 25 is supported on a narrow cantilevered arm portion 29 of the support member 21 which extends from a main portion 30 of the support member 21. A thin sticking layer (not shown), for example comprising copper, may lie between the support member 21 and the magnetic member 25. A thin conductive protective layer (not shown) such as gold may lie over the magnetic member 25 and optionally coat the support member 21, to help reduce charging up induced by the incident charged particles. The conductive protective layer may be connected to the electrical ground of the microscope apparatus or to an electrical bias referenced to this ground. In some embodiments, the magnetic member 25 can extend into the opening 24 unsupported. Alternatively, one or more non-magnetic members, such as optional radial support members 105, 106, may form bridge(s) between the aperture edge and the magnetic member 25 to support the distal end 27 of the magnetic member.

The phase plate 13 lies in a plane intersected by the optic axis 9, for example, in a plane normal to optical axis 9. The phase plate 13 may be positioned near the back focal plane 14 of the objective lens 12, in a plane conjugate to the back focal plane 14, such as conjugate plane 102, or near the probe forming aperture in an electron probe forming system.

The phase plate 13 is positioned such that the distal end 27 of the magnetic member 25 lies close to the optical axis 9. For TEM, the magnetic member 25 does not intersect and cross the optical axis 9, thus allowing bright field images to be collected. However, in some embodiments, the magnetic member 25 may intersect and cross the optical axis allowing dark field images to be collected in TEM. In probe forming applications, such as STEM and SEM, the magnetic member 25 may intersect and cross the optical axis 9. The phase plate 13 may be moveable between first and second positions in which the magnetic member 25 respectively crosses and does not cross the optical axis 9.

The longitudinal axis 26 and the optical axis 9 may be separated by a small distance, for example, up to about 10 percent of the aperture diameter, d.

As shown in FIG. 6, the magnetic member 25, or portion of the member 25, may be inclined to the plane 31 which is perpendicular to the optical axis 9. A section of the magnetic member 25 proximate to the distal end 27 may be inclined and form an angle in the range 45°<θ1<135° relative to the optic axis 9. The support member 21 and proximal end of the magnetic member 25 may lie in a plane inclined to the plane perpendicular to the optic axis. For example, the angle of inclination, θ2, between the support member 21 and the optical axis 9 may be in the range 70°<θ2<110°. In the case that θ1 does not equal θ2, there may also be a curved portion 107 of the magnetic member 25 as shown in FIG. 6.

The curved section 107 may be produced by altering deposition conditions for the coating on the top side of the bar to be more tensile the than underside and so achieve an upward curve.

Near the probe forming aperture 101 of a probe forming system, such a STEM, or near planes conjugate or equivalent the back-focal plane 12, such as conjugate plane 102, in TEM, there is usually no significant magnetic field. Thus, when the phase plate 13 is located in these positions, the magnetic member 25 is configured to retain its magnetisation in the absence of an external applied magnetic field.

However, in the back focal plane position 14 of a typical TEM objective lens there is often (although not always) a magnetic field. As the objective lens 12 (FIG. 1) is typically round (i.e. rotationally symmetric), this magnetic field B0 is directed in meridonal planes, with axial and radial components. Thus, if the magnetic member 25 is placed in a meridonal plane, thereby causing the axis 26 of the magnetic member 25 and optical axis 9 to intersect, the magnetic member 25 is subjected to an external magnetic field with components directed along the axis 26 and the optical axis 9.

B0 may typically have a component B0z parallel to the optical axis of the order of 1 Tesla (T). The radial component B0r can be found in a round lens using a series expansion giving B0r=−(½) B0z'(z) r to the first order. B0z'(z) may typically be of order 100 T/m in the region of the objective aperture in a TEM. Thus, the radial field component B0r magnitude linearly increases from 0 T at the optical axis 9 to around 10 mT when r, the distance from the axis, is 200 µm.

Micromagnetic simulations using OOMMF (OOMMF User's Guide, Version 1.0, M. J. Donahue and D. G. Porter, NIST, Gaithersburg, Md. (September 1999)) show that a rectangular bar with thickness 20 nm, width 200 nm and length 100 µm, comprised of typical ferromagnetic materials, for example permalloy (80 Ni/20 Fe) or cobalt, can sustain the single domain state with the magnetisation directly sufficiently along the axis 26 at zero applied external field.

These simulations further show that for magnetic bars having a thickness less than the width and the thickness is of the order of 20 nm, where the bar is formed from a typical ferromagnetic material (such as cobalt or permalloy), the magnetisation 28 tends to be oriented towards a plane 31b containing the width and length dimensions, even in the presence of an external magnetic field perpendicular to this plane (and hence in direction of the thickness direction). For example, for a bar comprised of cobalt (assuming saturation magnetisation Ms=1.4×10$^6$ A m$^{-1}$, exchange coupling A=1.4×10$^{-11}$ J, and anisotropy constant K=0) with the dimensions mentioned above, initially in the remnant magnetic state that follows from being magnetized along its longest axis, a magnetic field applied perpendicular to the plane 31b of magnitude 1 T (typical for B0z described earlier) orients the average magnetisation in the bar only around 43° from the plane 31b. Thus, the magnetisation does not go entirely out of plane 31b being much less than 90°. Similar behaviour is seen in other ferromagnetic materials, however, in lower saturation field materials such as permalloy the sustainable field perpendicular to the of plane 31b in general is less, or the direction of the magnetisation from the plane is greater for a similar applied field. With permalloy for example, a 1 T out-of-plane field orients the magnetisation at an angle which is almost entirely out of the plane. However, a 0.6 T out-of-plane field orients the magnetization at an angle which is only around 44° from the plane 31b.

For an additional field of the order 10 mT, a typical radial field B0r at the back focal plane as described earlier, acting along the long axis 26 of the bar 25 in the simulation, may further help keep the magnetisation near the plane 31b, provided that component of remnant state magnetisation along the axis 26 has the same sense (i.e. is not anti-parallel) as the radial field. As described earlier, the magnetic bar 25, or a portion of it, may be inclined from the perpendicular the optic axis, having θ1 and/or θ2 not equal to 90°. Thus, there may also exist a further magnetic field component along the axis 26 of the bar 25, due to the bar 25 not being perpendicular to B0z. Again, provided the sense of this magnetic field is aligned with the component of remnant state magnetisation along the axis 26, this helps keep the magnetisation near the plane 31b With the phase plate magnetic bar 25 positioned in the typical magnetic field present at the back focal plane of a TEM, it is also possible to prepare the magnetic bar into its initial single domain state by rotating the aperture such that θ1 and θ2 are both approximately 0° or 180°, or at an angle which places a component of B0z along the axis 26 sufficient to saturate the magnetic bar and form a single domain state.

Once in this state the aperture may be rotated back to a position where the magnetic bar 25 has a reduced inclination to the plane 31, as previously described.

The magnetisation calculated using OOMMF software can then be exported to other software to calculate the long-range stray magnetic field. Here, Comsol® 4.1 software is used to calculate the stray field B field, originating from a magnetic bar 25 having a thickness of 20 nm, a width of 200 nm and a length of 100 µm and assuming a uniform magnetisation of $8\times10^5$ A m$^{-1}$ directed along its length.

Figure 7:
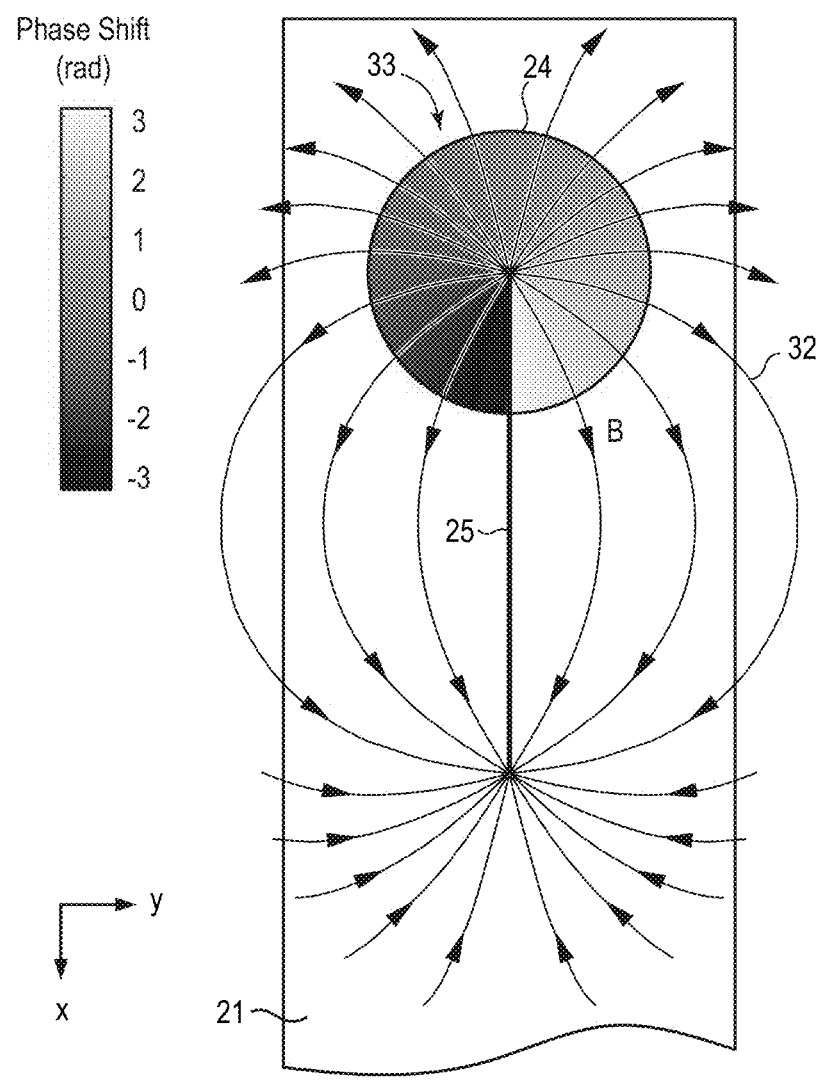
FIG. 7 is a two-dimensional greyscale plot of phase shift for electrons passing through the phase plate shown in FIG. 4 overlaid with representative calculated magnetic field lines.

FIG. 7 shows typical magnetic flux flow-lines representing the stray magnetic field 32, B, calculated with Comsol® upon the bar modelled as just described. This magnetic field, B, 32 is shown directed from the distal end 27, though it may also be directed towards the distal end 27 if the member 25 is magnetized in the opposite sense.

This uniform magnetisation approximation appears valid from comparisons with some models created with an accurately exported magnetisation field from OOMMF. However, the magnetisation may deviate from being aligned along the member 25 in an end section close to the distal end 27 having a length of about 1 to 2 µm. This edge effect does not, however, significantly affect the far field pattern displayed in region far (for example, more than 10 µm) from the magnetic member 25.

With knowledge of the magnetic field B, which can be considered to be the curl of the vector potential A, the phase shift φ of electrons passing parallel to the optical z-axis and resulting from the magnetic field, can be found using the standard phase object approximation (see for example, "Electron interferometry and interference electron microscopy", G. F. Missiroli, G. Pozzi, and U. Valdre, Journal of Physics E: Scientific Instruments 14 (6), 649 (1981)):

$$\phi(r) = -\frac{2\pi e}{h} \int_l A_Z(r,z) dz. \quad (1)$$

Here $A_z$ is the z-component of the vector potential A, r is a position vector perpendicular to the optic (z-) axis, l is an electron path parallel to the optical axis, e is the elementary electronic charge and h is Planck's constant. Here, use of equation (1) is allowed as the typical electron energy is greater than 5 keV, and the electron paths are to a good approximation parallel to the axis. Equation (1) also shows that magnetic fields components oriented perpendicular to the plane 31 do not produce an observable phase shift effect. This further justifies the use of the uniform magnetization assumed in the model of the magnetic bar presented in FIG. 7.

Consistent with this, the difference in phase Δφ that exists between two paths, $l_1$ and $l_2$, which start from the same point and finish at the same point is $$\Delta\phi = \frac{2\pi e}{h} \oint_{l_1+l_2} A \cdot ds \quad (2)$$

This is the contour integral over that path described by the paths $l_1$ and $l_2$ and ds is the elemental vector pointing along the paths. By Stokes' theorem, this is equal to the integral of the curl of A, or equivalently the magnetic flux density B, over a closed surface bounded by $l_1$ and $l_2$. Thus, with the magnetic bar 25, the maximum phase difference $\Delta\phi_{max}$ which can occur between electrons traversing opposite sides of the magnetic bar cross section is $$\Delta\phi_{max} = \frac{2\pi e}{h}\Phi, \quad (3)$$

where Φ is the magnetic flux passing through a transverse cross section of the magnetic bar in a plane parallel to the primary direction of the electron paths, which in this example is the z-direction parallel to the optic axis as used in equation (1). Thus, to achieve a maximum phase difference of about 2π, the magnetic bar contains a magnetic flux Φ of about $h/e=4.136\times10^{-15}$ Wb. For typical ferromagnetic materials, such as nickel (Ni), cobalt (Co) and iron (Fe) and their alloys (such as permalloy), with saturation magnetisation in the approximate range 0.6-2.1 T, this value of magnetic flux can be achieved for a magnetic member 25 having a cross sectional area of around $2\times10^{-15}$ m$^2$ to $7\times10^{-15}$ m$^2$. For a strip or bar having a rectangular cross section and a thickness of about 20 nm, this corresponds to a width of about 100 to 350 nm. If the magnetic bar is intended to be used while immersed in a magnetic field at the back focal plane as previously described, allowance will additionally need to be made for a component of the magnetization being oriented out of plane, and the consequent reduction in flux passing through the cross section in the plane perpendicular to plane 31.

Based on typical model results shown in FIG. 7 which illustrates the magnetic field B, the magnetic member 25 contains a magnetic flux of about $4\times10^{-15}$ Wb, thus producing a maximum phase shift of about 2π using equation (3). In this model, the distal end 27 is offset from the centre of the aperture by 100 nm, in order to allow brightfield TEM imaging. Extracting the vector potential A from the Comsol® model and then applying equation (1) through numerical integration with Matlab® allows the phase shift for electrons or other charged particles passing the bar to be calculated. This phase shift is shown in a grayscale 33 in FIG. 7, and also as a shaded surface in a perspective plot 34 with contour lines 35 in FIG. 8.

Figure 8:
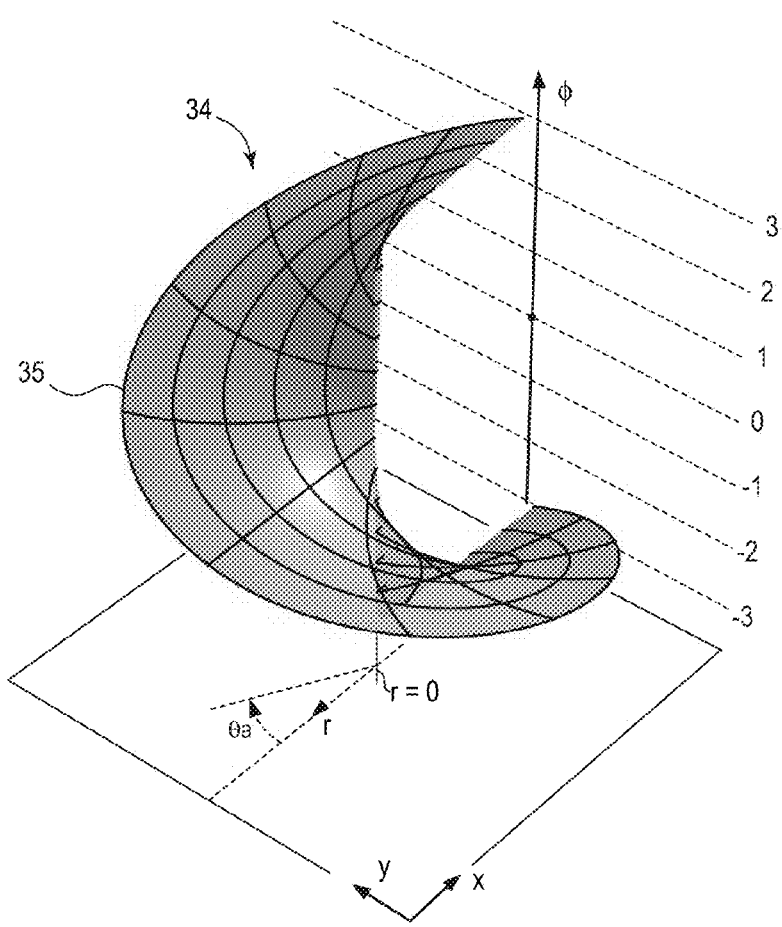
FIG. 8 is a three-dimensional shaded surface with contour lines showing the phase shift for electrons passing through the phase plate shown in FIG. 4.

As shown in FIG. 8, looking in particular at contour line 35, the phase shift 33 produced by the free end 27 (FIG. 4) of the magnetic member 25 is spiral like, centred on a point near to the end 27 of the member 25. However, the magnetic member 25 does not produce a perfect spiral phase.

Figure 9:
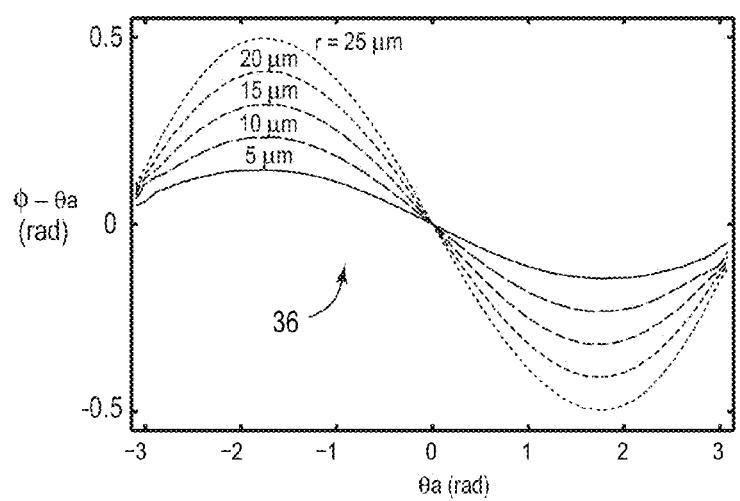
FIG. 9 illustrates variation in the phase shift from an ideal spiral phase with azimuth angle.

FIG. 9 is a plot 36 of phase shift minus the azimuth angle $(\phi-\phi_A)$ against the azimuth angle, $\phi_A$, for various radial coordinates, namely r=5 µm, 10, µm, 15 µm, 20 µm and 25 µm. An ideal spiral phase would give $(\phi-\phi_A)=0$ over $\phi_A$. However, in this case deviations of up to around 0.5 radians are observed.

Placing the magnetic member 25 at or near the back focal plane 14 produces a phase shift in what is effectively the Fourier transform of the sample image in a TEM. Although the phase plate 13 can be positioned at the back focal plane 14, it need not be positioned there. It could, for example, be positioned at plane conjugate to this such as conjugate plane 102 (FIG. 1).

As described earlier, the contrast for imaging weak phase objects in a TEM is usually described using a phase contrast transfer function (PCTF), which describes the relationship of contrast in the image with the spatial-frequency components in the (weak-phase) object as described in for example Chapter 6 of J. C. H. Spence: High Resolution Electron Microscopy (3rd Ed, Oxford University Press, 2003) and L. Riemer and H. Kohl, Transmission Electron Microscopy: Physics of Image Formation, (5th Ed, Springer, 2008).

Figure 10:
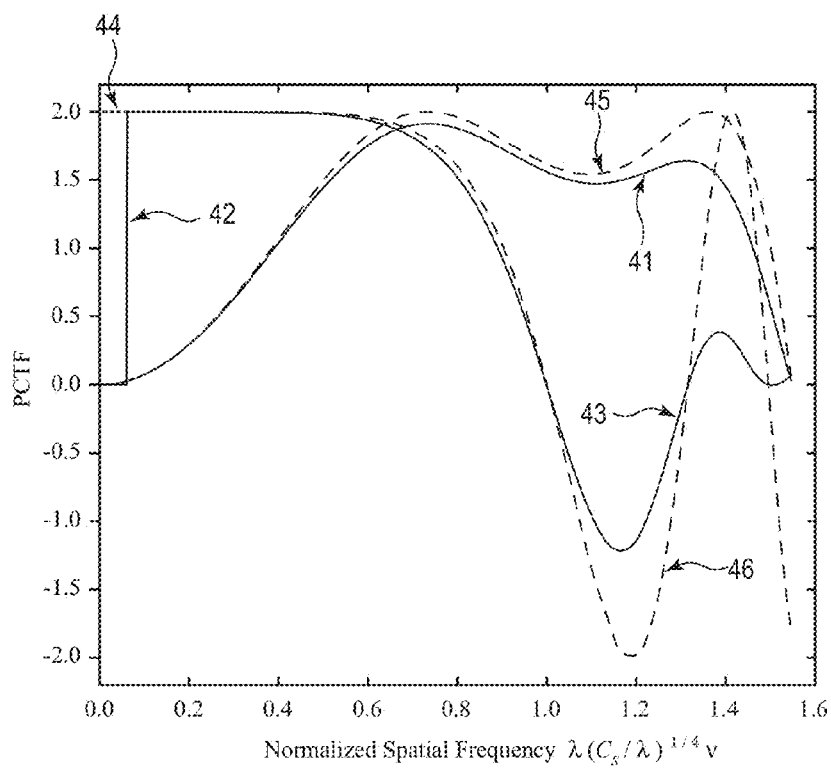
FIG. 10 illustrates a phase contrast transfer function for weak phase objects for a conventional transmission electron microscope operating at Scherzer defocus with no phase plate and at focus with a Zernike phase plate and a Hilbert phase plate.

Referring to FIG. 10, PCTFs calculated using the methods described Spence ibid. and Chapter 6.4 of Riemer and Kohl ibid. plotted against the normalized spatial frequency, $v_{norm} = \lambda(C_S/\lambda)^{1/4} v$, where $\lambda$ is the electron wavelength, $C_S$ is the spherical aberration coefficient, and $v$ is the spatial frequency, are shown. Characteristics are given for a conventional TEM (CTEM) operated at Scherzer defocus 41, with a Zernike phase plate at focus 42, 43, and with a Hilbert phase plate at focus 43, 44. Above the cut-off frequency 42, the Hilbert and Zernike plates have the same characteristics. The Scherzer defocus condition is where the objective lens is slightly underfocused on the sample with defocusing $\Delta z = 1.21 (C_S\lambda)^{1/2}$. This is commonly used to obtain the widest possible spatial frequency passband with no contrast inversions and good intensity over the passband.

These characteristics 41, 42, 43, 44 also include the effects of a damping envelope for a typical TEM (see for example, Chapter 3 of Spence ibid.), which serves to lower the contrast at higher frequencies, and accounts for some 'blurring' in the system from lens instabilities and chromatic aberrations, along with the finite extent of the illumination. The form of this damping envelope is taken as $$\exp\left(-\frac{1}{2}\left(\frac{\theta^2 \Delta \pi}{\lambda}\right)^2\right) \frac{2J_1(|q|)}{|q|} \quad (4)$$

where $\theta$ is the angle at formed at the back focal plane point under consideration, $\Delta$ is the standard deviation for the distribution of focus values, $\lambda$ is the electron wavelength, $J_1(x)$ is Bessel function of the first order and kind, and q is taken to be $$2\pi\theta_C(\Delta z K + \lambda(\lambda C_S - i\pi\Delta^2)K^3) \quad (5)$$

where $\theta_C$ is the illumination semi-angle, K is the scattering vector in the back focal plane ($|K|=\sin\theta/\lambda$), $C_S$ is the spherical aberration coefficient, and $\Delta z$ is the defocus increment. Here, $C_S=0.7$ mm, $\Delta=4$ nm, $\theta_C=1.5$ mrad and a beam voltage of 100 kV are assumed in forming the damping envelope for the model. Thus, the characteristics 41, 42, 43 and 44 are not universal when plotted against in the 'normalized' co-ordinate $v_{norm}$. For comparison, characteristics without this damping envelope applied, which are thus universal, are also given under the same focus conditions for the conventional TEM 45 and Zernike phase plate 46.

From the PCTF 41 for the CTEM operated at Scherzer defocus, it is apparent that the contrast at low normalized spatial frequency, say $v_{norm}<0.2$, is low, less than around 0.3 or 20% of the peak available contrast. The PCTF of a TEM fitted with a Zernike phase plate operated at focus condition 42, 43 has improved contrast at low spatial frequency, for example offering a contrast of around 2.0 when $v_{norm}=0.2$, though notably there is cut-off frequency 42 below which no contrast improvement is given. This is caused by the Zernike phase plate having to use a central region of finite extent which incurs a phase delay $\pi/2$ less than the surrounding region. Here the central region diameter is considered to be around 4% of the aperture diameter, 2 µm for a typical 50 µm aperture. Also the frequency at which inversion of contrast occurs for a TEM with a Zernike phase plate is less than for the CTEM operated at Scherzer defocus. However, with the Zernike phase plate it is noted that use of a defocus condition, namely $\Delta z=0.73 (C_S\lambda)^{1/2}$ as described in R. Danev, K. Nagayama, Transmission Electron Microscopy with Zernike Phase Plate, Ultramicroscopy 88, 243 (2001), increases the width of the first passband but it is still less than that available with CTEM.

Figure 11:
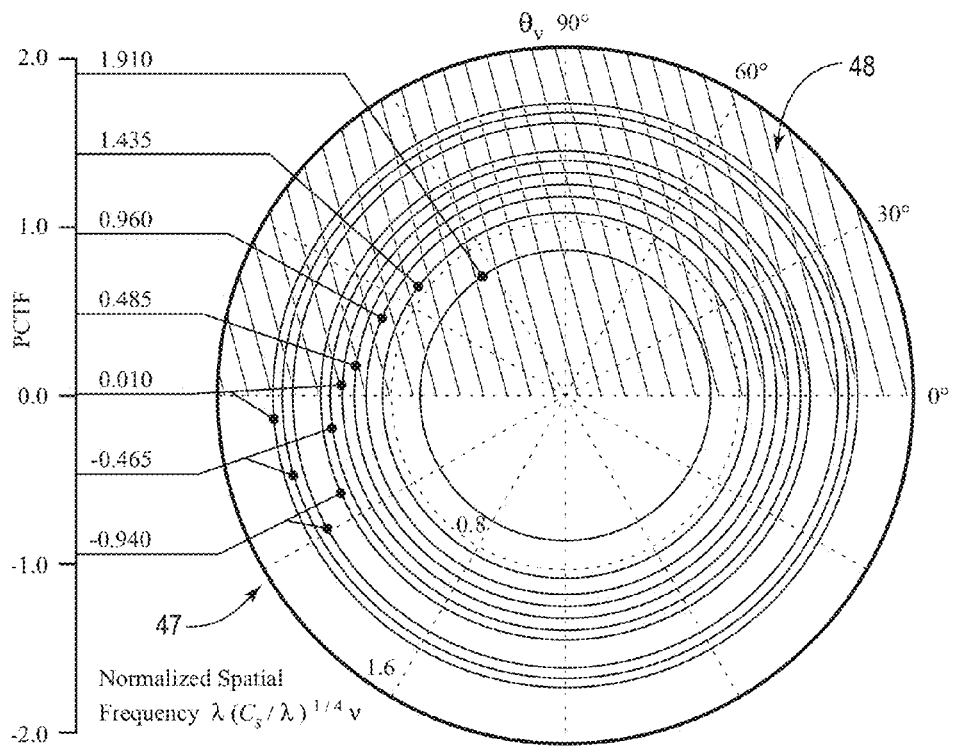
FIG. 11 illustrates a phase contrast transfer function of a conventional transmission electron microscope at focus with a Hilbert phase plate using a contour plot in two-dimensional spatial frequency space, with hatching showing regions of phase inversion.

The CTEM 41, 45 and CTEM with Zernike phase plate PCTFs 42, 43, 46 are rotationally symmetric and thus are adequately represented in FIG. 10. However, the CTEM with Hilbert phase plate PCTF 44, 43 is not rotationally symmetric. Referring to FIG. 11, the CTEM with Hilbert phase plate PCTF amplitude is shown as a contour plot 47 upon the two-dimensional normalized spatial frequency co-ordinate space, with a hatched region 48 showing where the phase of the PCTF is shifted by $\pi$ (i.e. 'inverted'). Thus, the line plot 44 shows the amplitude of the Hilbert PCTF but ignores its phase.

Applying the methods used to calculate these PCTFs in combination with fast Fourier transform techniques, such within Matlab® as described in Chapter 4 of J. D. Schmidt, Numerical Simulation of Optical Wave Propagation, SPIE (2010), allows the determination of PCTFs for a perfect 'spiral' phase plate and for the phase plate of this invention.

Figure 12:
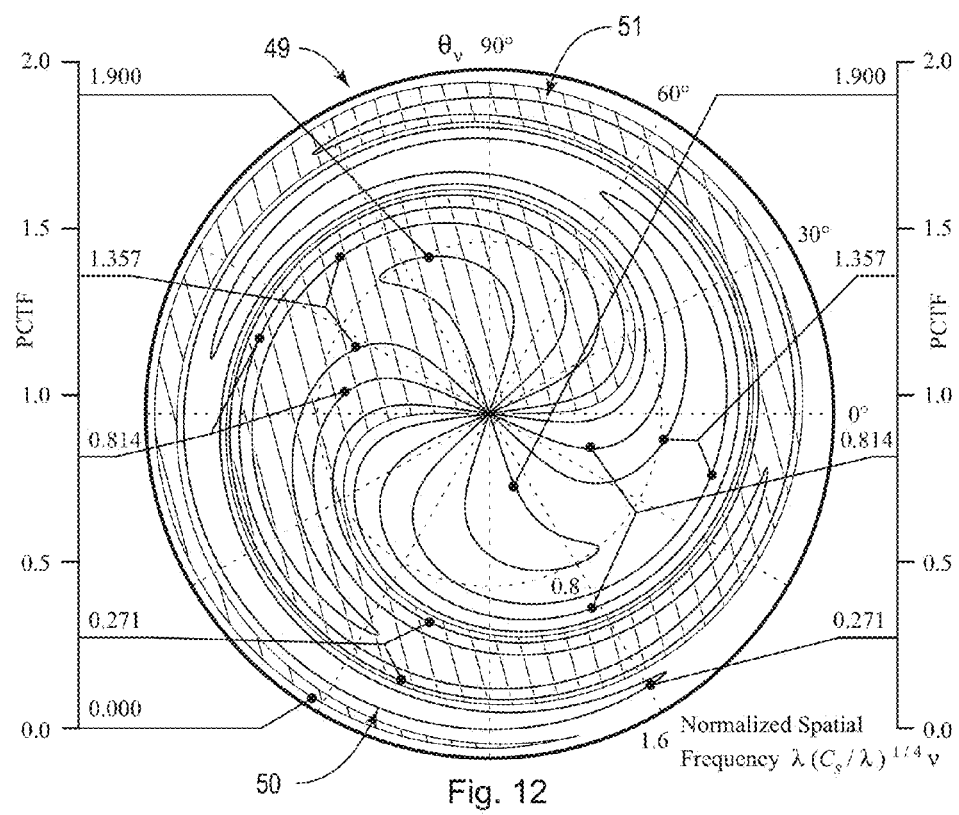
FIG. 12 illustrates a phase contrast transfer function of a conventional transmission electron microscope at focus with perfect spiral phase plate using a contour plot in two-dimensional spatial frequency space, with hatching showing regions of phase inversion.

Referring again to FIG. 9, a perfect spiral phase plate would exhibit a characteristic of $\phi-\phi_A=0$ for all r. The PCTF 49 for a CTEM with a phase plate having the perfect spiral phase variation (FIG. 12) with a typical TEM damping envelope applied as described above, is represented with contours 50 and hatched regions 51 indicating a $\pi$ phase shift in the PCTF, in the same manner as the PCTF 47, 48 for a CTEM with Hilbert phase plate. The contours 50 and the shape of the hatched $\pi$ phase shifted region 51 are seen to be spiral like.

Referring again to FIG. 12, the PCTF 49 is seen to vary with the angle $\theta_v$ in the spatial frequency plane. In particular when $\theta_v=90°$ we see that PCTF tends towards 2 as the spatial frequency approaches 0, and as the normalized spatial frequency tends to towards 1, the PCTF amplitude approaches 0, before its phase is inverted. In this $\theta_v=90°$ direction the behaviour is thus similar to the Hilbert phase plate characteristic 43, 44. In the $\theta_v=0°$ direction the PCTF 49 approaches 0 as the spatial frequency approaches 0, then increases to peak magnitude as the normalized spatial frequency tends to towards 1. In this $\theta_v=0°$ direction the behaviour is thus similar to the CTEM PCTF characteristic 41.

Figure 13:
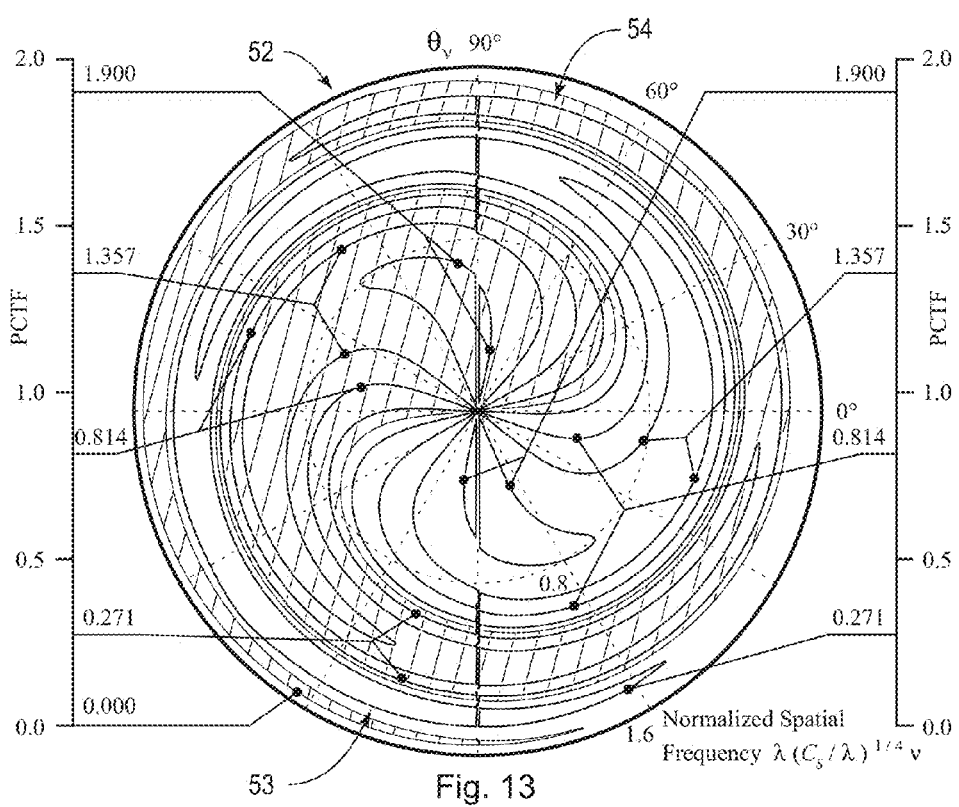
FIG. 13 illustrates a phase contrast transfer function of a conventional transmission electron microscope at focus with a model of the phase plate of this invention using a contour plot in 2D spatial frequency space, with hatching showing regions of phase inversion.

The PCTF for a phase plate having the phase variation shown in FIGS. 8 and 9, and described earlier as being representative of the phase plate 13 is calculated in a similar manner giving the PCTF 52 in FIG. 13. In this calculation the magnetic bar is offset from the optical axis 9, as shown in FIG. 5, by 100 nm to allow for bright-field imaging in the TEM. It is seen that the contours 53 and hatched regions 54 indicating an inversion of phase have a similar spiral like form to the PCTF resulting from a perfect spiral phase plate 49. However, it is seen that along the $\theta_v=90°$ direction there is some reduction in contrast in comparison to the perfect spiral. Primarily this is due to the magnetic bar 25 intersecting some of the scattered electrons at the back focal plane and hence blocking some spatial frequency components. The characteristics of the Zernike phase plate 42, 43, 46 and Hilbert phase plate 44, 43, 46, 47, 48 presented take no account of blocking of spatial frequency components by any support structures that may be required for their physical realization.

The images realized within a TEM combined with the described phase plates can be simulated with knowledge of the PCTFs and by application of Fourier transform methods, for example within Matlab®, noting the limits of the standard weak phase object approximation, again see for example Chapter 3 of J. C. H. Spence: High Resolution Electron Microscopy (3rd Ed, Oxford University Press, 2003). Here image simulations are presented under the additional constraint of the objective aperture half-angle (which determines the cut-off for higher frequency components in the image) being equal in all the simulations to the half-angle required for the maximum width passband without contrast inversions under the Scherzer defocus condition in the conventional TEM. Further, a damping envelope is applied as described in Equations (4) and (5), with typical parameters given there for a 100 kV TEM. Thus, the images given are most representative of TEM imaging at around 100 kV.

Figure 14:
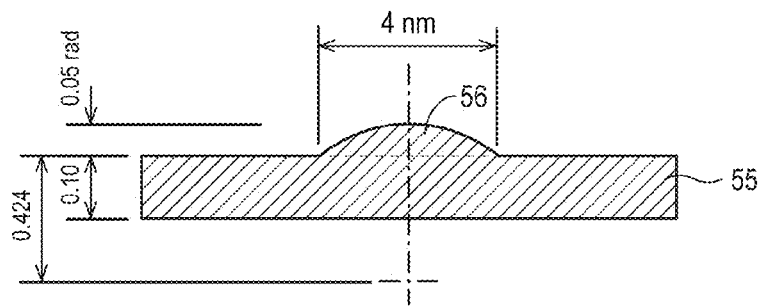
FIG. 14 illustrates a cross-section of the droplet object used for image simulations.

Images from a rotationally symmetric 'droplet' sample object are considered, where the sample has a cross section as in FIG. 14, comprised of a uniform 'support membrane' 55 giving a phase delay of 0.1 radians, with an ellipsoidal cap central mound 56, having base diameter 4 nm and peak additional phase delay of 0.05 radians. The centre of the ellipsoidal cap is at a point equivalent to a phase delay of 0.424 radians beneath its base. For an object made of carbon, imaged at 100 keV this corresponds to an object with an approximate peak height of 0.7 nm and diameter 4 nm upon a 1.4 nm background support membrane, with the centre of the ellipsoid 5.9 nm beneath the surface. This may for example approximately represent a globular protein upon a cellular membrane in a biological sample.

Figure 15:
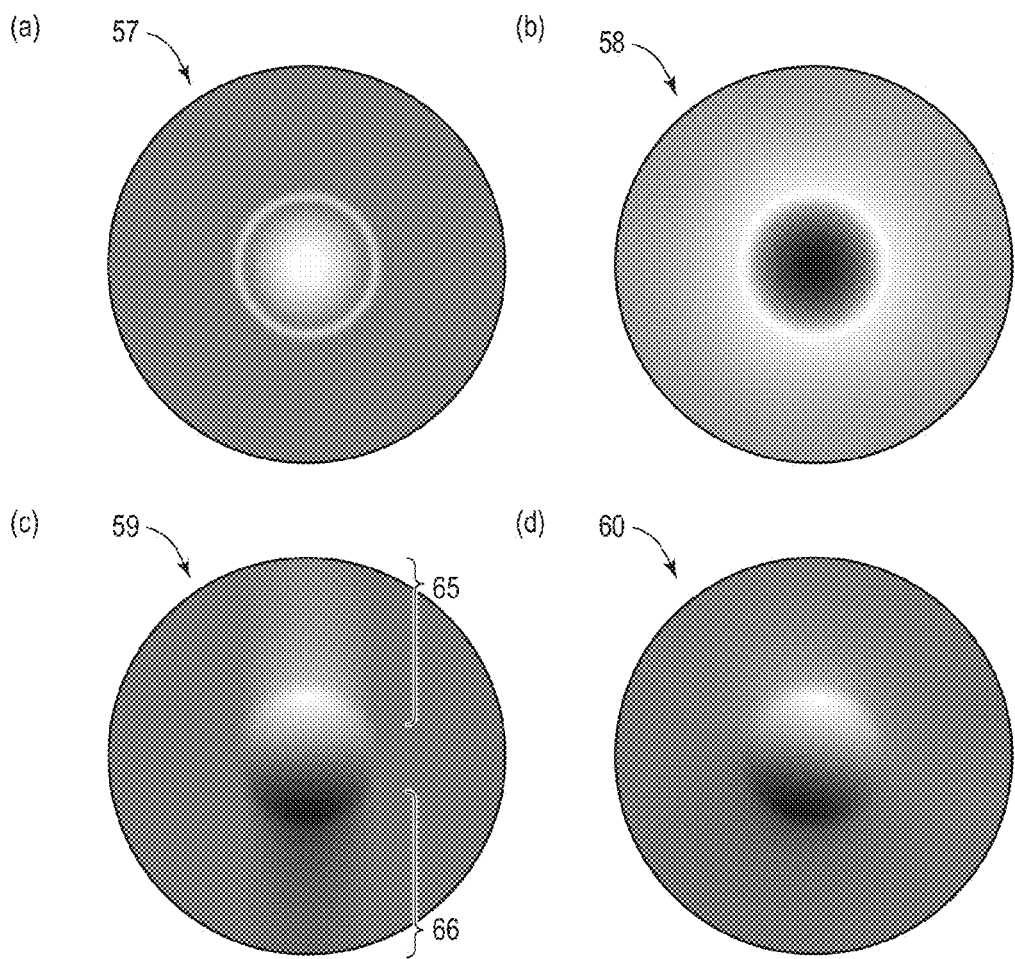
FIG. 15 illustrates simulated images over 12 nm diameter field of view of the droplet object shown in FIG. 14 formed in a conventional transmission electron microscope at Scherzer defocus with no phase plate (a) and at focus with a Zernike phase plate (b), with a Hilbert phase plate (c) and with an embodiment of a phase plate in accordance with the present invention (d)
Figure 16:
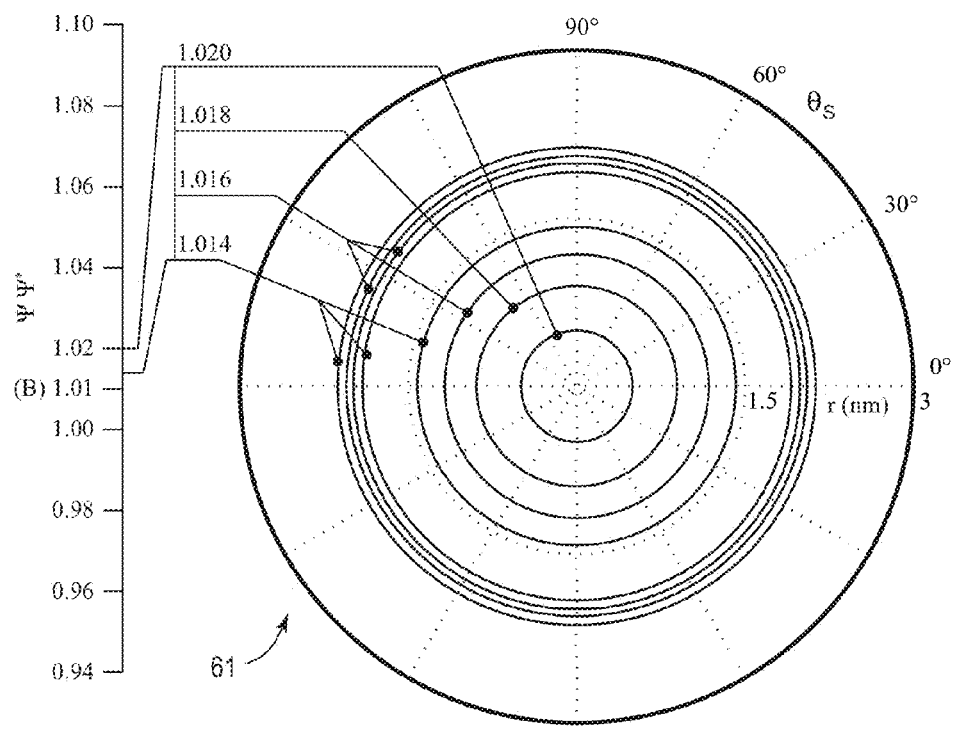
FIG. 16 illustrates absolute image intensity in a simulated image of the droplet object shown in FIG. 14 formed in a conventional transmission electron microscope at Scherzer defocus, given as a contour plot.
Figure 17:
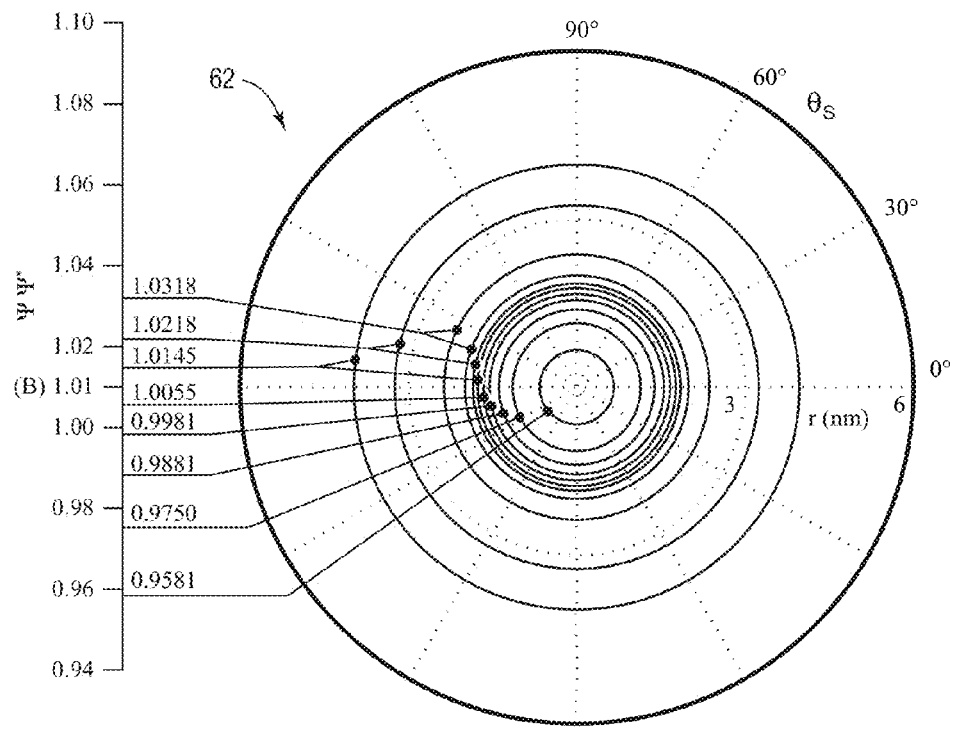
FIG. 17 illustrates absolute image intensity in a simulated image of the droplet object shown in FIG. 14 formed in a conventional transmission electron microscope at focus with a Zernike phase plate, given as a contour plot.

Referring to FIG. 15, the gray-scale images 57, 58, 59, 60 are adjusted to give similar levels of viewed contrast and brightness in the figure, although they give no sense of the absolute image intensity.

Referring to FIGS. 16, 17, 18 and 19, contour plots 61, 62, 63, 64 give the absolute intensity, I, of the simulated images 57, 58, 59, 60 respectively. In these figures, the viewed image intensity is taken as proportional to the $|\Psi|^2$, where $\Psi$ is imaging particle wave function at the image plane.

Image contrast is defined can be calculated using $$\text{Contrast} = \frac{I_{max} - I_{min}}{I_{max} + I_{min}}, \quad (6)$$

where $I_{max}$ is the maximum intensity and $I_{min}$ is the minimum intensity in the image.

As shown in FIGS. 16, 17, 18, and 19, an embodiment of a phase plate in accordance with the present invention in a CTEM at focus produces a greater contrast than the CTEM operating at Scherzer defocus with no phase plate and in a CTEM at focus with a Zernike phase plate.

Figure 18:
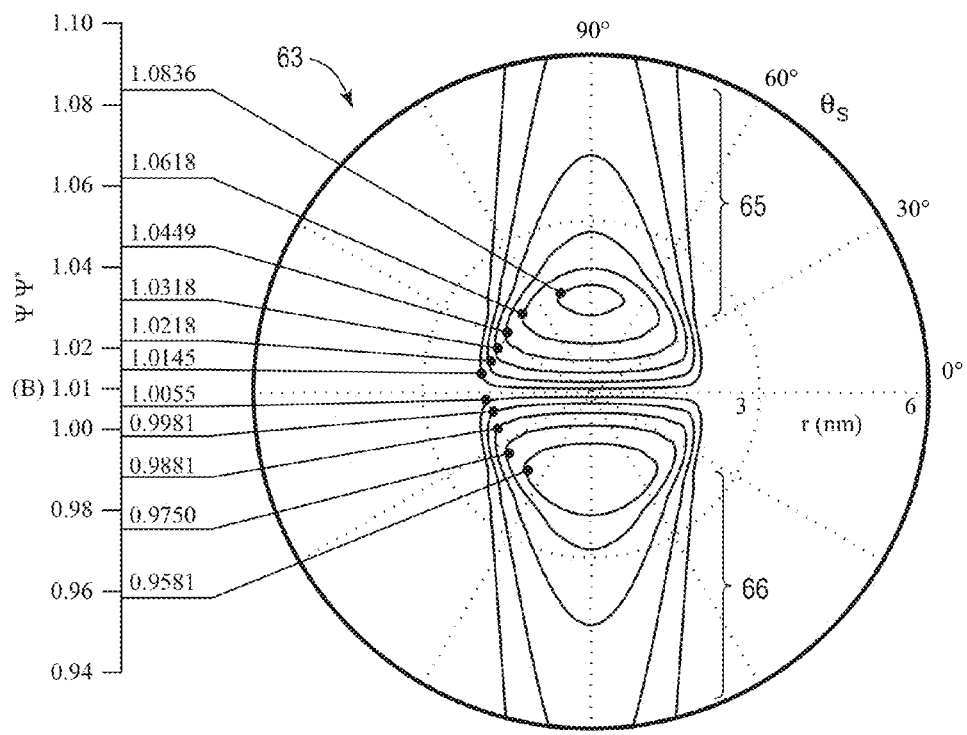
FIG. 18 illustrates absolute image intensity in a simulated image of the droplet object shown in FIG. 14 formed in a conventional transmission electron microscope at focus with a perfect Hilbert phase plate, given as a contour plot.
Figure 19:
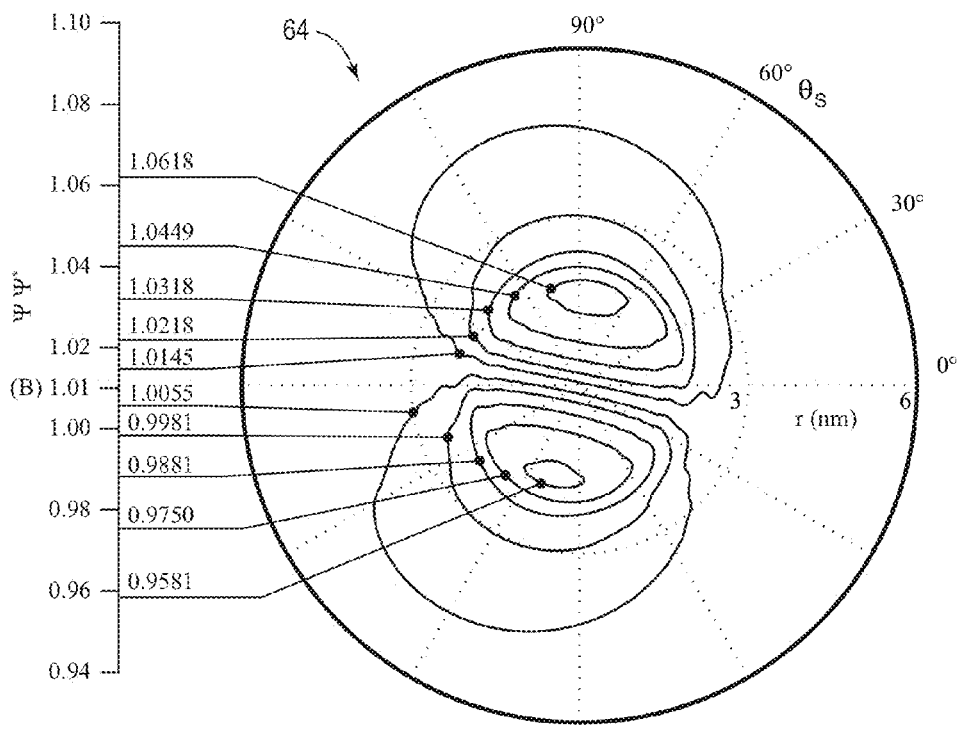
FIG. 19 illustrates absolute image intensity in a simulated image of the droplet object shown in FIG. 14 formed in a conventional transmission electron microscope at focus with an embodiment of a phase plate in accordance with the invention, given as a contour plot.

Although the phase plate of this invention does not produce greater contrast than a CTEM with an ideal Hilbert phase plate, see FIG. 18, the images it produces generally suffer fewer and/or less long range artefacts.

Artefacts of the Hilbert plate manifest themselves as long-range relief shading including artefacts 65, 66 (FIGS. 14c and 18).

Referring to FIG. 18, a 'light' shading artefact 65, the contours with an intensity of 1.0318 and 1.0218, extends to a distance of around 4 nm and greater than 6 nm from the image centre respectively. For comparison, in FIG. 19 for an embodiment of the present invention, the contours with intensity 1.0318 and 1.0218 both extend to less than 2.5 nm from the image centre. The 'dark' shading artefact 66 is similar: for the Hilbert plate (FIG. 18) contours of 0.9881 and 0.9981 extend to around 4 nm and greater than 6 nm respectively, whereas in the phase plate of this invention these contours extend to a distance no greater than about 2.5 nm from the image centre.

Considering these example images, the reduced range of imaging artefacts achieved by the present invention in comparison to the Hilbert phase plate, permits the TEM operator to discern the origins of the observed contrast within a greater portion of any field of view (FOV). For example in a circular FOV with the Hilbert phase plate it is possible that the image has an outer annulus of greater than 6 nm width with contrast resulting from features outside of the FOV. However, for a phase plate in accordance with the present invention, the width of this annulus would be less than around 5 nm, considering the contours of greatest spatial extent in FIG. 19.

Referring again to FIGS. 4 and 5, the phase plate 13 need not directly cross or interact with the unscattered electron beam 8 (FIGS. 1 and 2). The end 27 of the magnetic member 25 can be offset from the central axis 9. A perfectly aligned Hilbert plate and some forms of Zernike plate directly intersect the unscattered electron beam. As the unscattered beam often has a high intensity in weak phase objects, Hilbert plates and some forms of Zernike plate are more prone to electron beam induced damage, such as from electron beam induced contamination and charge up.

Referring to FIG. 3, in a scanning probe system, such as scanning electron microscope (SEM) or scanning transmission electron microscope (STEM), the phase plate 13 would simply be placed at the beam forming (objective) aperture position 101. In this arrangement a 'point' electron source replaces the object considered for TEM applications.

Figure 20:
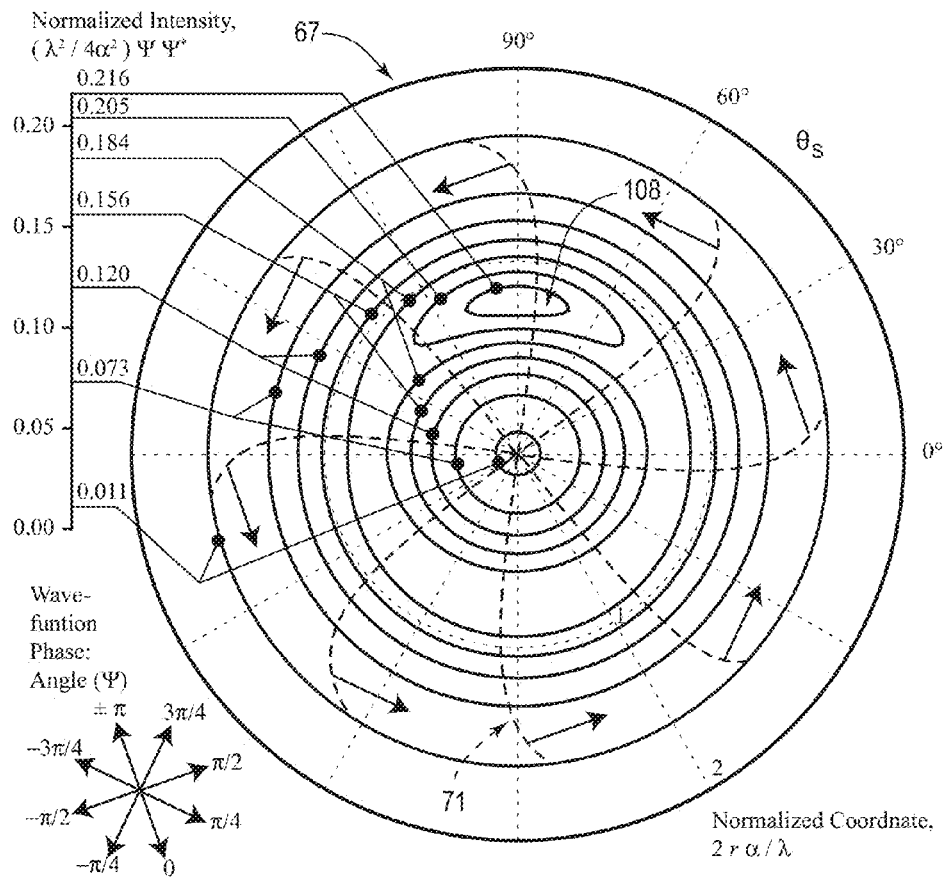
FIG. 20 illustrates point spread function of a focussed electron beam formed through an embodiment of a phase plate in accordance with the present invention, given as a contour plot of intensity with contours of the associated wave-function phase.

Using the same methods for modelling TEM image intensity described previously, the image intensity for this point object, otherwise known as the focussed beam point spread function (PSF), for a system incorporating the previously used model of the phase plate in accordance with the present invention is shown in FIG. 20 as a contour plot 67. Here, the spatial coordinate, r, in the image plane has been normalized by multiplication with $\alpha/\lambda$ where $\alpha$ is the aperture half angle at the image plane, and $\lambda$ is the electron wavelength. The image intensity is also normalized and the $(r, \theta_S)$ coordinate system in the image plane perpendicular to the beam is centred on the central minimum in the intensity.

Figure 21:
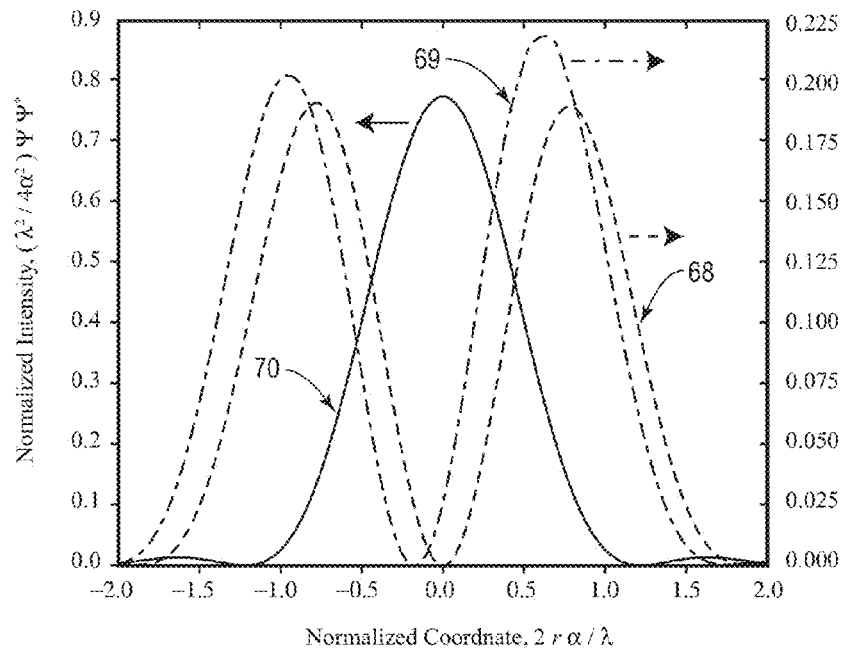
FIG. 21 illustrates intensity of the point spread function shown in FIG. 20 at azimuth angles of 0° and 90°, with a comparison point spread function for a beam formed through a simple circular aperture.

Referring also to FIG. 21, the PSF intensity in the $\theta_S=0°$ and $\theta_S=90°$ directions (68 and 69 respectively) has a central minimum. Here, however, the normalized coordinate axis origin is not centred upon the minimum intensity, but on the position of maximum intensity for the PSF resulting from a normal circular aperture 70, given for comparison.

From these figures it appears that the PSF has an annular form, though with a definite asymmetry appearing along the $\theta_S=90°$ direction 69. The peak intensity occurs approximately along the $\theta_S=90°$ direction and from the contour plot 67, the peak 108 has a crescent-like form (see the contours at 0.205 and 0.216).

Referring again to FIG. 20, the produced PSF wave-function has a phase, shown as arrows with dashed contour lines 71, which varies from $-\pi$ to $+\pi$ around the tangential direction of the annular PSF. Thus, the beam has a degree of 'vorticity' as also present in beams produced by micro-fabricated diffraction gratings, see for example J. C. Idrobo and S. J. Pennycook, Journal of Electron Microscopy, 60, 195 (2011). The beam phase variation around the tangential direction, or vorticity, can be either 'left-handed' or 'right-handed' depending on the magnetisation sense of the magnetic member 25.

While FIGS. 20 and 21 show the PSF resulting from the phase plate in accordance with the present invention with the magnetic member magnetized to contain a flux of about h/e $4.1 \times 10^{-15}$ Wb through equation (3) to give a maximum phase shift of $2\pi$, it is also possible for the magnetic member to contain a flux to give a maximum phase shift not equal to about $2\pi$. In this case, for the beam PSF to have the highest 'purity' of vorticity, the magnetic flux contained in the bar should cause a maximum phase shift near an integer multiple, n, of $2\pi$. Here, 'purity' of vorticity is taken to mean a beam PSF having the most annular intensity distribution with minimal sidelobes, minimal crescent-like peaks such as 108, or minimal other non-annular features.

In the example given in FIGS. 20 and 21, the nearest non-zero integer to $\Phi e/h$ is 1 and the phase of the wavefunction going around the annular PSF in the region of significant intensity changes through $\Delta p=2\pi$. In general if $\Phi e/h$ is far from an integer, the PSF is composed of at least two dominant 'modes' corresponding to the integer n values above and below $\Phi e/h$. These modes are characterized by $\Delta p=2\pi$ n. The n=0 mode corresponds to a nominally uniform beam PSF wave-function phase as would be caused by a normal circular aperture without any magnetic member.

The arrangement of this invention can be more easily incorporated into a microscope so as to introduce beam phase vorticity than, for example, other arrangements which involve a micro-fabricated grating.

Figure 22:
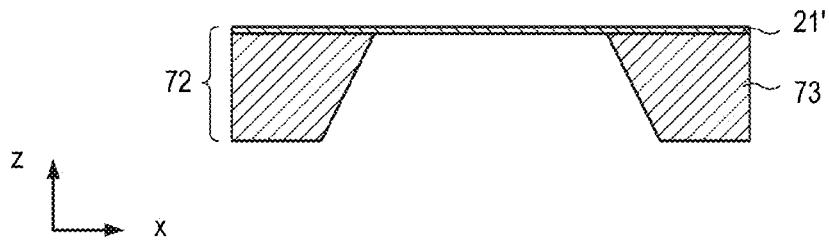
FIG. 22 is a cross sectional view of a silicon nitride membrane which is supported on a silicon frame which is used to fabricate an embodiment of a phase plate in accordance with the present invention.
Figure 23:
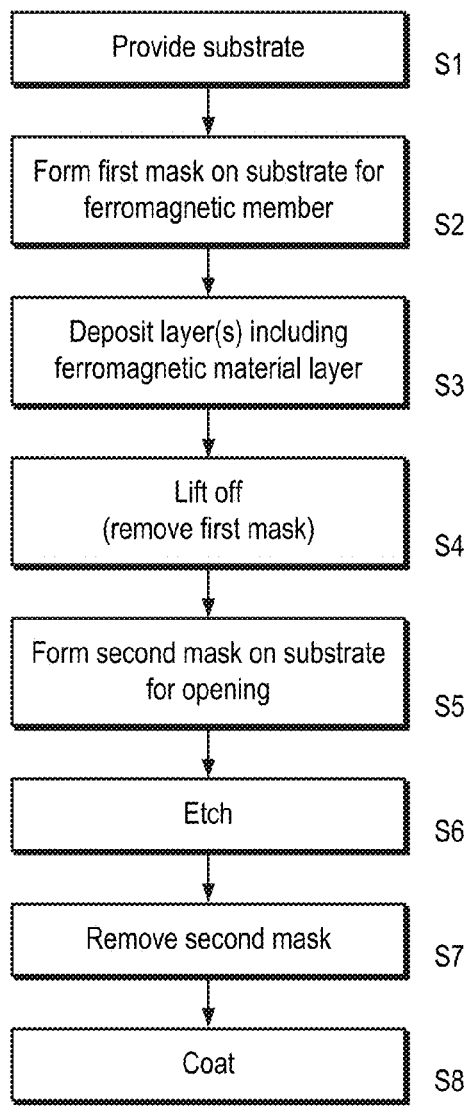
FIG. 23 is a process flow diagram of a method of fabricating the phase plate shown in FIGS. 4 to 7.

Referring to FIGS. 22 and 23, a method of fabricating the phase plate 13 will now be described.

The phase plate 13 can be formed on a substrate 72 comprising a silicon nitride membrane 21' supported on a silicon carrier 38 (step S1). The membrane 21 can have dimensions of about 200 μm×200 μm square with a thickness of 100 nm.

A first patterned layer of resist (not shown) is formed (step S2). This stage may include using a double layer of electron-beam resist which can help provide an undercut resist profile and, thus, help with subsequent lift-off. For example, a first layer of electron-beam resist may comprise AR-P617 (which is Copolymer PMMA/MA 33° A in 1-methoxy-2-propanol) provided by Allresist Gmbh. The resist can be applied at 5000 rpm and cured 170° C. A second layer of electron-beam resist may comprise 950 k PMMA (2% in anisole). The resist is applied at 5000 rpm and cured at 150° C. A high-resolution electron beam is used to expose the resist and is then developed, for example, using IPA:$H_2O$ (3:1) at 10° C. for 3 minutes.

One or more layers is then deposited by sputter deposition or UHV evaporation (step S3). The layers may include an adhesion-promotion layer, such as 10 nm of copper (Cu), a ferromagnetic layer, such as 20 nm of cobalt (Co) and a protective layer, for example, 5 nm of gold (Au).

Unwanted regions of metallization are lifted-off in acetone (step S4).

A second patterned layer of resist (not shown) is formed (step S5). A layer of electron-beam resist may comprise 950 k PMMA (8% in anisole). The resist is applied at 5000 rpm and cured at 120° C. A high-resolution electron beam is used to expose the resist and is then developed, for example, using IPA:$H_2O$ (3:1) at 10° C. for 7 minutes. A short oxygen plasma descum (30 sec in 150 W in oxygen plasma barrel etcher) can be used to ensure an exposed surface.

The opening is then etched (step S6). This stage may comprise reactive ion etching though the silicon nitride layer using $CF_4/O_2$. Typical conditions are 45 sec at 300 W, 20 mTorr using 40 sccm $CF_4$ and 4 sccm $O_2$.

The second mask is removed (step S7). This may stage may comprise using low-power oxygen plasma barrel etcher, for example, 15 minutes at 150 W Finally, the structure can be sputter coated on both sides with about 75 nm of gold (Au) (step S8).

In some embodiments, the support member 21 may comprise a layer of material (or more than one layer of material) of sufficient thickness to be opaque to incident charged particles. In this example, a gold coating is applied on both sides of the support member 21 and magnetic member 25 having a thickness of about 75 nm which is opaque to electrons with energy of about 5 keV. This allows the formation of a 5 keV electron scanning probe, as shown in FIG. 3, with a well controlled aperture angle, with reduced influence in the probe from electrons that would otherwise be scattered from passage through the support member 21 and magnetic member 25.

However, the support member 21 and magnetic member 25 may also not be completely opaque to charged particles impinging upon it. For example, when the phase plate 13 is used in a TEM at the back focal plane or a plane conjugate to this, the support member is mostly intersected by electrons representing the higher spatial frequency components of the sample. Thus if these electrons pass through the support 21 and are scattered, only information concerning these high frequency components would be lost, presenting a generally incoherent background to the resulting image. Further it is noted that the contrast arising from such high frequency components is in general damped, as often described in practice by equation (4).

Any scattering occurring through the magnetic member 25 may also present an incoherent background to the resulting image, though the intensity of any incoherent background so produced is reduced by minimizing the width of the magnetic member.

It is also possible to form the magnetic member 25 separately and position the member over the aperture.

The phase plate 13 can be positioned using a micro-positioning apparatus, such as piezo drive units, to align the magnetic member 25 close to the centre of a separate objective aperture (not shown) and/or to the optical centre of microscope column so as to position the magnetic member close to the centre position of un-scattered electrons in the back focal plane of TEM.

Certain embodiments of a phase plate can offer advantages in TEM and in other modes of charged microscopy, in particular to scanning TEM (STEM) and other scanning microscopy techniques that collect backscattered charged particles. In STEM, for example, a focussed electron probe is scanned over the sample while scattered electrons are detected and recorded, to allow the composition of an image of the electron scattering variation with position in the sample.

Placing the phase plate in a probe forming optical arrangement creates a charged particle beam which has a degree of vorticity or orbital angular momentum. The creation of such beams is currently achieved by placing a micro-fabricated grating in the beam path and then selecting an off-axis diffracted beam to pass through further optics to form a focussed probe, see for example J. C. Idrobo and S. J. Pennycook, Journal of Electron Microscopy, 60, 195 (2011). Such beams may be used to measure the magnetic properties of materials.

A phase plate in accordance with the present inventions allows the creation of such beams in a simpler on-axis arrangement, where the phase plate can be positioned at the conventional beam limiting aperture position. Moreover, with this on-axis arrangement the resulting vortex beam is brighter than is produced with a diffraction grating where beam intensity is lost in unused diffraction orders.

It will be appreciated that many modifications may be made to the embodiments hereinbefore described.

The microscope may be a scanning $He^+$ ion system.

A coil (not shown) may be placed over the proximal end of the bar to tune magnetic flux in the bar 25.

The invention claimed is:

1. A phase plate for a charged particle beam system comprising:
   a support having a through-hole; and
   an elongate member which is magnetisable in a direction along its length, which extends only partially across the through-hole and which is narrower than the through-hole, wherein the elongate member and the support are coated with a conductive layer, the conductive layer being electrically coupled to a ground potential.

2. A phase plate according to claim 1, wherein the elongate member has a width no more than 1 μm and, optionally, no more than 500 nm.

3. A phase plate according to claim 1, wherein the elongate member has a width, w, the through-hole has a width, d, wherein $d \geq 20 \cdot w$.

4. A phase plate according to claim 1, wherein the through-hole has a diameter or largest dimension, d, and the elongate member has a length, L, such that $L \geq d$.

5. A phase plate according to claim 1, wherein the through-hole has a midpoint between first and second points on a perimeter of the through-hole, wherein
the elongate member extends from the first point on the perimeter towards the second point without crossing the midpoint.

6. A phase plate according to claim 1, wherein the through-hole is generally circular.

7. A phase plate according to claim 1, wherein an arm portion of the support member extends into the through-hole, the arm portion supporting the elongate member.

8. A phase plate according to claim 1, wherein the elongate member has a thickness of no more than 200 nm and, optionally, no more than 100 nm.

9. A phase plate according to claim 1, wherein the elongate member has a thickness of at least 5 nm and, optionally, at least 10 nm.

10. A phase plate according to claim 1, wherein the elongate member comprises nickel, cobalt and/or iron.

11. A phase plate according to claim 1, wherein the elongate magnetic member has a magnetic flux of $4 \times 10-15$ Wb.

12. A phase plate according to claim 1, wherein the elongate member has a width, w, the through-hole has a width, d, wherein $d \geq 50 \cdot w$.

13. A phase plate according to claim 1, wherein the elongate magnetic member has a magnetic flux which is an integer multiple of $4 \times 10-15$.

14. A phase plate according to claim 1, wherein an end of the elongate member is located over the through-hole.

15. A charged particle beam system comprising:
a charged particle beam source;
an objective lens; and
a phase plate according to claim 1 disposed downstream or upstream of the objective lens.

16. A charged particle beam system according to claim 15, wherein the phase plate is disposed at or near to a back focal plane of the objective lens.

17. A charged particle beam system according to claim 15, which is operable as a transmission electron microscope and/or which is operable as a scanning electron microscope or a scanning transmission electron microscope.

* * * * *